(12) United States Patent
Jiang (10) Patent No.: US 6,365,842 B1
(45) Date of Patent: *Apr. 2, 2002

(54) ELECTRICAL CIRCUITS, CIRCUITS, AND ELECTRICAL COUPLINGS

(75) Inventor: Tongbi Jiang, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 09/679,336

(22) Filed: Oct. 4, 2000

Related U.S. Application Data (60) Continuation of application No. 09/145,485, filed on Sep. 1, 1998, now Pat. No. 6,137,063, which is a division of application No. 09/032,437, filed on Feb. 27, 1998, now abandoned.

(51) Int. Cl.$^7$ .......................... H01R 12/04; H05K 1/11
(52) U.S. Cl. ...................... 174/261; 174/259; 174/260
(58) Field of Search ............................... 174/257, 259, 174/260, 261; 361/767, 773, 774, 783, 803; 257/737, 773, 777, 778; 439/53, 74, 75

(56) References Cited

U.S. PATENT DOCUMENTS

| | | | |
|---|---|---|---|
| 3,757,075 A | | 9/1973 | Munt |
| 3,897,126 A | * | 7/1975 | Frances et al. ......... 339/17 LC |
| 4,664,309 A | * | 5/1987 | Allen et al. .............. 228/180.2 |
| 4,752,027 A | | 6/1988 | Gschwend |
| 4,818,728 A | | 4/1989 | Rai et al. |
| 4,838,800 A | * | 6/1989 | Lynch .......................... 439/78 |
| 4,878,611 A | | 11/1989 | LoVasco et al. |
| 4,914,057 A | | 4/1990 | Gloton |
| 4,922,321 A | | 5/1990 | Arai et al. |
| 4,940,181 A | | 7/1990 | Juskey, Jr. et al. |
| 4,970,780 A | | 11/1990 | Suda et al. |

(List continued on next page.)

FOREIGN PATENT DOCUMENTS

| | | |
|---|---|---|
| JP | 57-176738 | 10/1982 |
| JP | Sho.64-8647 | 1/1989 |
| JP | 1-120039 | 5/1989 |

OTHER PUBLICATIONS

Assembly with Conductive Adhesives, K. Gilleo, Solder and Surface Mount Technology, No. 19, p. 12, Aug,/Sep., 1994.
An Approach to the Anisotropic Conductive Adhesives for Micro–Interconnection Technology, Takao Komukai, Misuaki Miyazaki and Yuki Samejima, vol. 1, pp. 402–407, Sep. 10–12, 1996.
A New Anisotropic Conductive Film with Arrayed Conductive Particles, Kazuo Ishibashi and Jun Kimura, vol. 19, No. 4, pp. 752–757, Nov. 1996.
Band ICs to PCBs Without Overkill or Underfill and ACP Types/Applications, Toshiba Chemical America, Inc., Advanced Packaging, Mar. 1997.

*Primary Examiner*—Jeffrey Gaffin
*Assistant Examiner*—Jeremy Norris
(74) *Attorney, Agent, or Firm*—Well St John P.S.

(57) ABSTRACT

The present invention includes electrical interconnections, methods of conducting electricity, and methods of reducing horizontal conductivity within an anisotropic conductive adhesive. In one embodiment, an electrical interconnection configured to electrically couple a first substrate and a second substrate includes: a bond pad of the first substrate having a male configuration; and a bond pad of the second substrate having a female configuration, the bond pad of the second substrate being configured to mate with the bond pad of the first substrate during electrical connection of the bond pads of the first substrate and the second substrate. A method of conducting electricity according to the present invention includes providing first and second bond pads individually defining a planar dimension; coupling the first and second bond pads at an interface having a surface area greater than the area of the planar dimension; and conducting electricity between the first and second bond pads following the coupling.

42 Claims, 5 Drawing Sheets

U.S. PATENT DOCUMENTS

| | | |
|---|---|---|
| 5,019,944 A | 5/1991 | Ishii et al. |
| 5,068,714 A | 11/1991 | Seipler |
| 5,128,746 A | 7/1992 | Pennisi et al. |
| 5,130,779 A | 7/1992 | Agarwala et al. |
| 5,258,577 A | 11/1993 | Clements |
| 5,426,266 A | 6/1995 | Brown et al. |
| 5,451,174 A * | 9/1995 | Bogursky et al. ........... 439/876 |
| 5,505,367 A | 4/1996 | Degani et al. |
| 5,517,752 A | 5/1996 | Sakata et al. |
| 5,545,589 A | 8/1996 | Tomura et al. |
| 5,570,273 A * | 10/1996 | Siegel et al. ................ 361/773 |
| 5,611,140 A | 3/1997 | Kulesza et al. |
| 5,642,265 A * | 6/1997 | Bond et al. .................. 361/809 |
| 5,767,580 A | 6/1998 | Rostoker |
| 5,804,882 A | 9/1998 | Tsukagoshi et al. |
| 5,808,878 A | 9/1998 | Saito et al. |
| 5,886,415 A | 3/1999 | Akagawa |
| 5,926,694 A | 7/1999 | Chigawa et al. |
| 5,938,455 A * | 8/1999 | Glovatsky et al. ............. 439/74 |
| 5,946,553 A | 8/1999 | Wood et al. |
| 6,002,172 A * | 12/1999 | Desai et al. ................. 257/737 |
| 6,008,991 A * | 12/1999 | Hawthorne et al. ......... 361/707 |
| 6,087,597 A * | 7/2000 | Shimada et al. ............. 174/263 |

\* cited by examiner

ELECTRICAL CIRCUITS, CIRCUITS, AND ELECTRICAL COUPLINGS

RELATED PATENT DATA

This patent resulted from a continuation application of U.S. patent application Ser. No. 09/145,485, filed Sep. 1, 1998 now U.S. Pat. No. 6,137,063, entitled "Electrical Interconnections, Methods of Conducting Electricity, and Methods of Reducing Horizontal Conductivity Within an Anisotropic Conductive Adhesive", naming Tongbi Jiang as inventor, which resulted from a divisional application of U.S. patent application Ser. No. 09/032,437, filed Feb. 27, 1998, now ABN entitled "Electrical Interconnections, Methods of Conducting Electricity, and Methods of Reducing Horizontal Conductivity Within an Anisotropic Conductive Adhesive", naming Tongbi Jiang as inventor, and which is now U.S. Pat. No. 6,137,063 the disclosure of which is incorporated by reference.

TECHNICAL FIELD

The present invention relates to electrical interconnections, methods of conducting electricity, and methods of reducing horizontal conductivity within an anisotropic conductive adhesive.

BACKGROUND OF THE INVENTION

Integrated circuitry is utilized in an ever-increasing number of applications. To meet the needs of the expanding applications, new methods of packaging integrated circuits and connecting integrated circuits with other substrates or circuitry have been developed. Various factors must be considered when connecting integrated circuitry with an adjoining substrate or circuit. Such factors include reliability, performance or speed, and size requirements to meet the requirements of higher definition sub-micron integrated circuits.

Conventional circuit interconnections include flip chip bonding, tape automated bonding (TAB) and conventional wire bonding. Flip chip bonding is preferred in rapid communication or high performance applications because shorter signal paths are provided. The pads are provided upon one surface of the flip chip and the pads can be aligned with conductive pads on an opposing substrate for interconnection. Solder or some type of adhesive is typically used to couple the flip chip with the substrate.

Anisotropic conductive adhesives (ACA) including anisotropic conductive film (ACF) and anisotropic conductive paste (ACP) are used for fine pitch interconnections. These interconnections are utilized in exemplary applications including liquid crystal display (LCD) panels, tape carrier packages (TCP), printed circuit board (PCB) interconnections, indium tin oxide (ITO) connections, and flexible circuit substrate connections.

Such anisotropic conductive adhesives typically comprise an adhesive matrix and plural conductive particles within the adhesive matrix. The conductivity of the anisotropic conductive adhesive is determined by the weight percentage of the conductive fillers or number of conductive particles per unit area. The conductive particles are is randomly distributed throughout the adhesive matrix in conventional anisotropic-conductive adhesives.

Figure 1:
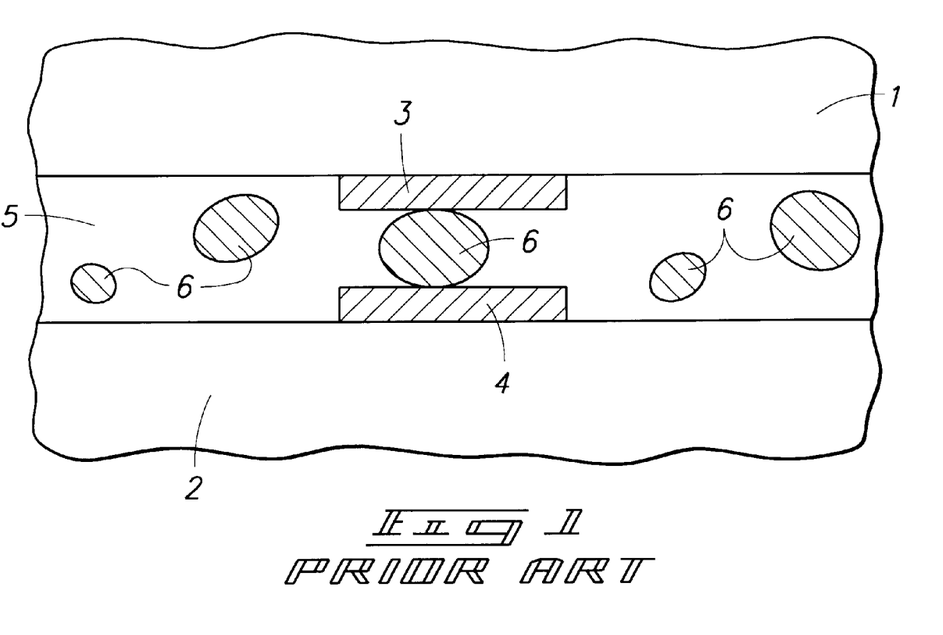
FIG. 1 is a cross-sectional view of a conventional anisotropic conductive adhesive provided intermediate two substrates.

Referring to FIG. 1, plural substrates 1, 2 are shown having respective opposing bond pads 3, 4. An anisotropic conductive adhesive 5 is applied intermediate substrates 1, 2. Anisotropic conductive adhesive 5 includes plural conductive particles 6. One conductive particle 6 intermediate bond pads 3, 4 provides electrical coupling of bond pads 3, 4.

Benefits of anisotropic conductive adhesives include the ability to provide electrical conduction in a z-axis or a vertical direction (i.e., intermediate bond pads 3, 4) while providing substantial electrical insulation in horizontal directions (i.e., insulate adjacent bond pads of the substrate). High definition- technologies require additional conductive particles (i.e., higher density of anisotropic conductive adhesives) to properly electrically connect all interconnections and bond pads of the devices being connected. Current density passing through the interconnection can be defined by the loading or density of particles in a given volume of the adhesive film and by the surface area of the interface coupling the contacts. Increasing the number of conductive particles results in increased current density.

However, increasing the number of conductive particles within the adhesive films also enhances the chances that the anisotropic conductive adhesive will be conductive in at least one horizontal direction. Such horizontal conduction can lead to short circuits and improper circuit performance.

Therefore, there exists a need to provide interconnections for fine pitch or high definition components without the drawbacks associated with the prior art devices and methodologies.

SUMMARY OF THE INVENTION

The present invention includes electrical interconnections, methods of conducting electricity and methods of reducing horizontal conductivity within an anisotropic conductive adhesive.

According to one embodiment, an electrical interconnection is configured to electrically couple a first substrate and a second substrate. The electrical interconnection includes plural electrical contacts. The contacts comprise bond pads of the respective substrates in one embodiment.

An electrical contact of the first substrate has a male configuration and an electrical contact of the second substrate has a female configuration in a preferred embodiment. The electrical contacts of the first and second substrates are configured to mate or couple to form an electrical interconnection. In one embodiment, the male configuration is convex and the female configuration is concave. At least a portion of the male configuration is preferably received within the female configuration during mating.

Other mating configurations can be utilized to form the electrical interconnection. The mating configurations are used to align or guide the substrates during coupling of the substrates in one embodiment.

In some embodiments, an adhesive is provided intermediate the electrical contacts of the electrical interconnection. One exemplary adhesive includes plural conductive particles for providing electrical coupling intermediate the electrical contacts. Such an adhesive comprises an anisotropic conductive adhesive configured to conduct electricity in a vertical direction. Anisotropic conductive adhesives are also configured to provide substantial electrical isolation in horizontal directions. The adhesive can be provided intermediate both substrates during coupling of the substrates.

The electrical contacts of one disclosed electrical interconnection are coupled at an interface. The electrical contacts are preferably configured to provide increased surface area at the interface. The surface area of the interface is ideally greater than a planar dimension defined by the electrical contacts.

Such an interface of increased surface area permits coupling of electrical contacts via an increased number of conductive particles within the adhesive. This configuration reduces resistance within the electrical interconnect. In addition, an anisotropic conductive adhesive having reduced conductive particle loading can be utilized in such configurations while maintaining a substantially similar vertical conductivity intermediate the electrical contacts. Anisotropic conductive adhesives having reduced conductive particle loading provide reduced horizontal electrical conduction and increased insulation of adjacent electrical interconnects.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 2:
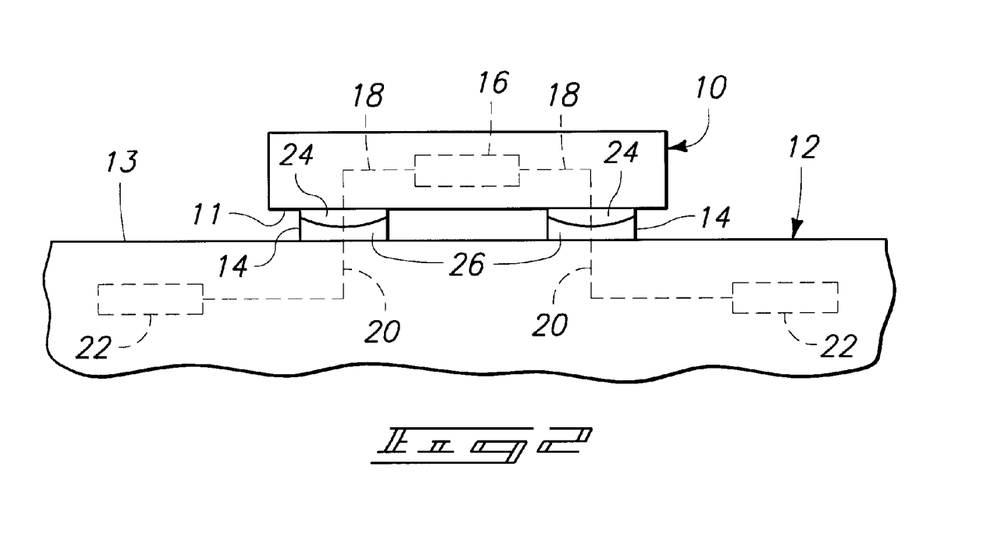
FIG. 2 is a cross-sectional view of a flip chip electrically coupled with a substrate.

Referring to FIG. 2, plural substrates 10, 12 are shown electrically coupled via plural electrical interconnections 14. Substrates 10, 12 include respective opposing surfaces 11, 13. In the described embodiment, substrate 10 comprises a flip chip and substrate 12 comprises a printed circuit board. Substrates 10, 12 comprise different devices in other embodiments. For example, substrates 10, 12 both comprise integrated circuits or flip chips, flexible electrical substrates, etc.

Flip chip 10 includes internal circuitry 16 and internal conductors 18 in the illustrated embodiment. Internal circuitry 16 is electrically coupled with electrical interconnections 14 via internal conductors 18.

Substrate 12 includes internal electrical connections 20 and electronic devices 22. Electrical connections 20 are coupled with electrical interconnections 14. Internal electronic devices 22 are coupled with internal electrical connections 20. Electrical interconnections 14 electrically couple substrate 10 and electrical internal circuitry 16 with substrate 12 and respective electronic devices 22.

Electrical interconnections 14 individually comprise plural electrical contacts 24, 26. Electrical contacts 24, 26 comprise bond pads in the illustrated embodiment. Other configurations of electrical contacts 24, 26 are possible. Electrical contacts 24 of substrate 10 are positioned to correspond to electrical contacts 26 of substrate 12. Electrical contacts 24, 26 of substrates 10, 12 are configured to form plural mated pairs. Electrical contacts 24 are formed upon surface 11 of substrate 10. Electrical contacts 26 are formed upon surface 13 of substrate 12.

Figure 3:
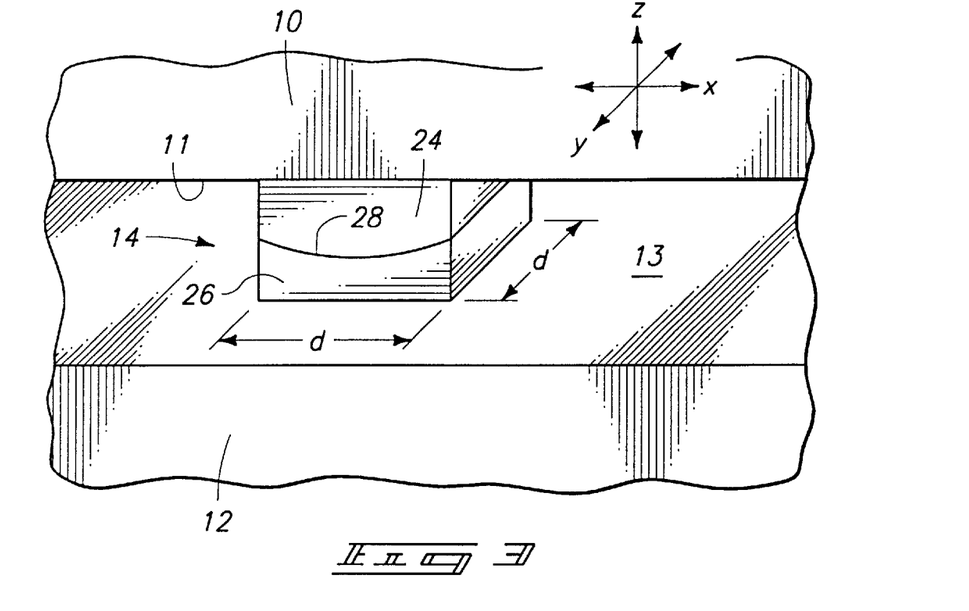
FIG. 3 is an isometric view showing details of an interconnection of the flip chip and substrate shown in FIG. 2.

Referring to FIG. 3, electrical interconnections 14 are described in detail. As described above, individual electrical interconnections 14 comprise mated pairs of electrical contacts 24, 26 of respective substrates 10, 12. In one embodiment, electrical contact 24 of electrical interconnection 14 has a male configuration 25 (shown in FIG. 5). Electrical contact 26 of electrical interconnection 14 has a female configuration 27 (shown in FIG. 5) configured to mate with male configuration 25 of electrical contact 24. Alternatively, electrical contacts 24, 26 can be configured to include a female configuration and a male configuration, respectively.

In the illustrated embodiment, electrical contact 24 has a substantially convex male configuration 25 and female electrical contact 26 has a complementary substantially concave female configuration 27. In particular, the mated pair of electrical contacts 24, 26 shown in FIG. 3 includes convex and concave bond pads having matching radii of curvatures. At least a portion of male electrical contact 24 is received within female electrical contact 26 during mating or coupling of contacts 24, 26 to form electrical interconnection 14.

Electrical contacts 24, 26 of other shapes may be provided as illustrated below. Electrical contacts 24, 26 can be formed by known methods in the art such as coating and micromachining.

Figure 4:
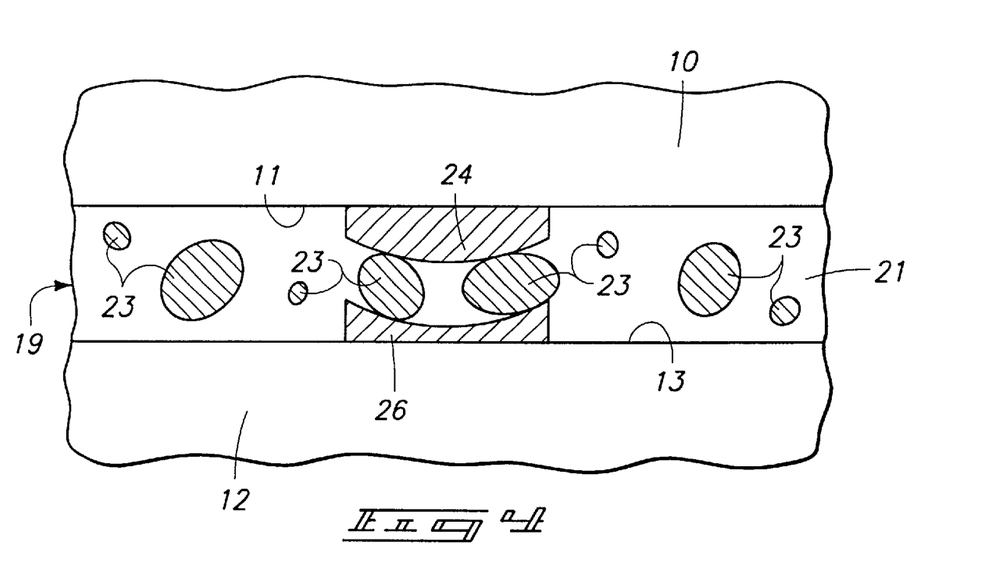
FIG. 4 is a cross-sectional view of an anisotropic conductive adhesive provided intermediate plural substrates.

Referring to FIG. 4, a layer 19 of conductive adhesive is preferably provided intermediate mating electrical contacts 24, 26. Adhesive layer 19 can extend intermediate substrates 10, 12 in addition to electrical contacts 24, 26 in some embodiments and as shown in FIG. 4.

Adhesive layer 19 comprises an anisotropic conductive adhesive in embodiment. The anisotropic conductive adhesive includes a film 21 and plural conductive particles 23 within film 21. The anisotropic conductive adhesive is configured to provide vertical conduction (conducts in the z-axis direction of FIG. 3) intermediate electrical contacts 24, 26 using conductive particles 23.

Exemplary anisotropic conductive adhesives have part designations XAP15, XAP17, and XAP24 and are available from Toshiba Corporation. Conductive particles 23 of the exemplary anisotropic conductive adhesives comprise gold coated polymer spheres or nickel spheres individually having a radius of three microns or five microns. For an adhesive layer 19 of sixteen microns thick, the Toshiba anisotropic conductive adhesives provide densities of 10,000 five micron particles 23 per square millimeter or 40,000 three micron particles 23 per square millimeter.

Ideally, anisotropic conductive adhesives provide minimal horizontal conduction (i.e., conduction in the x-y plane of FIG. 3). Horizontal conduction can result in short circuits of adjacent electrical interconnections and improper electrical performance of electrical circuitry 16, 22 within substrates 10, 12. Shorting of electrical interconnections can also damage electrical circuitry 16, 22.

One method of minimizing horizontal conductivity includes utilizing anisotropic conductive adhesives which have reduced conductive particle loading. Utilization of anisotropic conductive adhesives having reduced particle loading provides less chance of conducting in x-y plane.

Horizontal conduction can also be reduced according to the following. Electrical contacts 24, 26 of interconnection 14 are joined at an interface 28. Conductivity at interface 28 through anisotropic conductive adhesive 19 is determined by the surface area of interface 28 times the density (conductive particles per unit area) of the anisotropic conductive adhesive. Increasing the surface area of interface 28 results in an increase in the conductivity for a given unit of volume of anisotropic conductive adhesive 19 intermediate electrical contacts 24, 26. An interface 28 having an increased surface area requires an anisotropic conductive adhesive having fewer conductive particles to provide a substantially similar conductivity of an adhesive having more conductive particles (an example is described below with reference to FIG. 7). Such conductivity is provided because more conductive particles 23 contact the increased surface area of electrical contacts 24, 26 at interface 28 compared with conventional connections.

Referring again to FIG. 3, electrical contacts 24, 26 configured to form interface 28 having an increased surface area are described. Individual electrical contacts 24, 26 define a planar dimension substantially perpendicular to the flow of electricity or current through electrical interconnection 14. The respective planar dimensions can be defined at the interfaces of contacts 24, 26 with respective surfaces 11, 13 of substrates 10, 12. As illustrated in FIG. 3, the respective planar dimensions of electrical contacts 24, 26 comprise squares having individual sides of a length d. The defined planar dimensions individually have an area.

With the use of anisotropic conductive adhesives and in accordance with the present invention, it is preferred to provide the surface area at interface 28 greater than the surface area of the defined planar dimensions to improve the conductivity intermediate contacts 24, 26 at electrical interface 28. Electrical contacts 24, 26 having mating configurations 25, 27 according to the present invention are configured to provide an increased active surface area at interface 28 for interconnection of opposing electrical contacts 24, 26.

The joining of electrical contacts 24, 26 at interface 28 having an increased surface area enhances vertical (z-axis) conduction. In particular, such enhances the chances electrical contacts 24, 26 will be electrically coupled. Further, a more efficient z-axis contact is provided intermediate electrical contacts 24, 26, resistance within electrical interconnection 14 is reduced, and the chances of electrical bridging in the x-y plane is reduced.

Utilizing electrical contacts 24, 26 of the present invention provides increased surface area at interface 28 which enables utilization of an anisotropic conductive adhesive 19 having reduced loading of conductive particles 23 to provide substantially similar conductivity as that of an anisotropic conductive adhesive having greater conductive particle loading. Thus, the present invention provides substantially undiminished vertical conductivity through anisotropic conductive adhesive layer 19 intermediate electrical contacts 24, 26, while providing reduced conductivity in the x-y plane with the use of an anisotropic conductive adhesive layer 19 having reduced conductive particle loading.

Electrical contacts 24, 26 according to the present invention are configured to provide vertical conductivity via an increased number of conductive particles 23 for a given volume of adhesive 21 and an adhesive 21 having a certain loading or density of conductive particles 23. The corresponding increased number of conductive particles within the anisotropic conductive adhesive which provide vertical conductivity provides the reduced resistance intermediate electrical contacts 24, 26.

In sum, utilizing electrical contacts 24, 26 configured in accordance with the present invention in combination with an anisotropic conductive adhesive of reduced loading provides reduced horizontal conductivity within anisotropic conductive adhesive 21 while maintaining a given vertical conductivity through adhesive 21 intermediate electrical contacts 24, 26.

Referring to FIGS. 5–9, exemplary mating male and female electrical contacts 24, 26 are illustrated. Like reference numerals represent like components herein with any changes therebetween represented by an alphabetical suffix such as "a".

Figure 5:
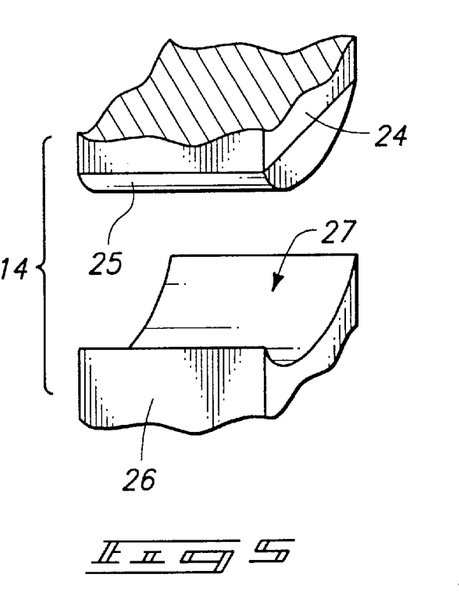
FIG. 5 is an isometric view of an electrical interconnection comprising mating concave and convex electrical contacts.

Referring to FIG. 5, electrical contact 24 includes a convex male configuration 25 and contact 26 includes a concave female configuration 27 in the illustrated pair of mating contacts.

Figure 6:
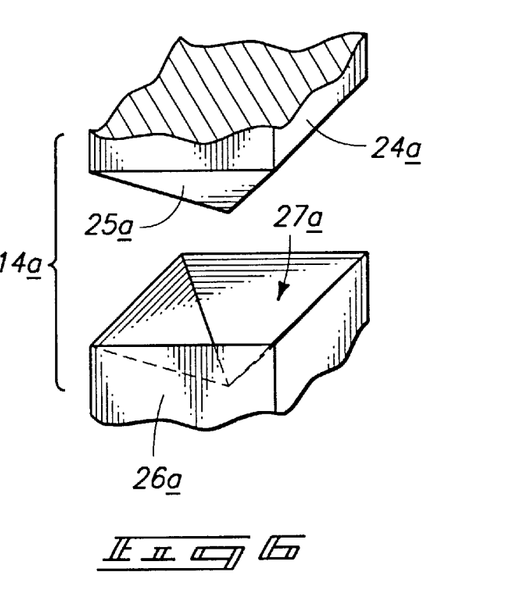
FIG. 6 is an isometric view of an electrical interconnection comprising mating pyramidal-shaped electrical contacts.

Referring to FIG. 6, electrical interconnection 14a is shown. Male configuration 25a of electrical contact 24a and female configuration 27a of electrical contact 26a are mating pyramidal-shapes in the illustrated electrical interconnection 14a.

Figure 7:
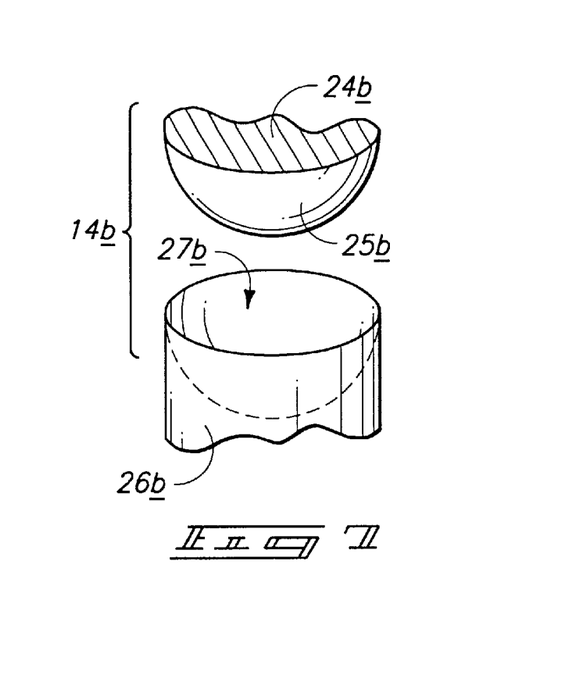
FIG. 7 is an isometric view of an electrical interconnection comprising mating spherical electrical contacts.

Referring to FIG. 7, electrical interconnection 14b is shown. Male configuration 25b of electrical contact 24b and female configuration 27b of electrical contact 26b are mating spherical-shapes in electrical interconnection 14b. Spherical-shaped configurations 25b, 27b provide an active surface area at interface 28 which is twenty-five percent greater than conventional flat electrical connections. In particular, a spherical bond pad with a radius of three thousands of an inch (mils), and a height of 1.5 mils, the changes of surface area is expressed by $$\frac{\Delta S}{S} = \frac{\pi(r^2 + h^2) - \pi r^2}{\pi r^2} = \left(\frac{h}{r}\right)^2 = 0.25.$$

Providing an increased surface area at interface 28 of twenty-five percent enables an anisotropic conductive adhesive having a density of 8,000 particles per square millimeter to provide substantially the same conductance as an anisotropic conductive adhesive having 10,000 particles per square millimeter.

In particular, density of conductive particles times surface area provides the conductance. A ratio of surface areas of conventional electrical contacts to the electrical contacts illustrated in FIG. 7 is 0.8 (determined by 1/1.25). Multiplying the original density by the determined ratio yields a reduced density adhesive which provides a substantially similar conductance as that of the original density adhesive when the reduced density adhesive is used with electrical contacts 24, 26 having mating surfaces of the increased surface areas.

As described above, reducing the conductive particle loading of the is anisotropic conductive adhesive provides less chance of electrical bridging in the x-y plane while providing substantially the same conductivity in the vertical or z-axis direction intermediate electrical contacts 24, 26.

Figure 8:
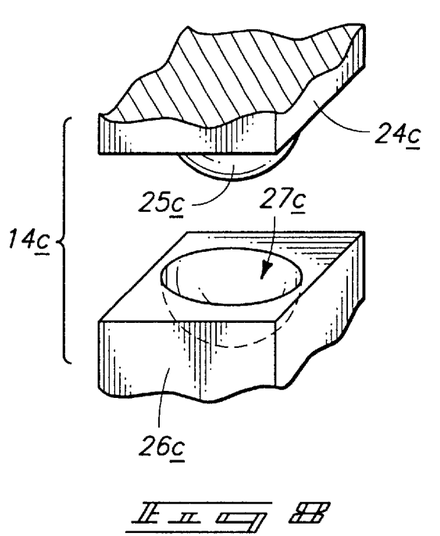
FIG. 8 is an isometric view of an electrical interconnection comprising mating dimple-shaped electrical contacts.

Referring to FIG. 8, electrical interconnection 14c is shown. Electrical contact 24c includes a dimple-shaped male configuration 25c and electrical contact 26c includes a mating dimple-shaped female configuration 27c in the illustrated electrical interconnection 14c.

Figure 9:
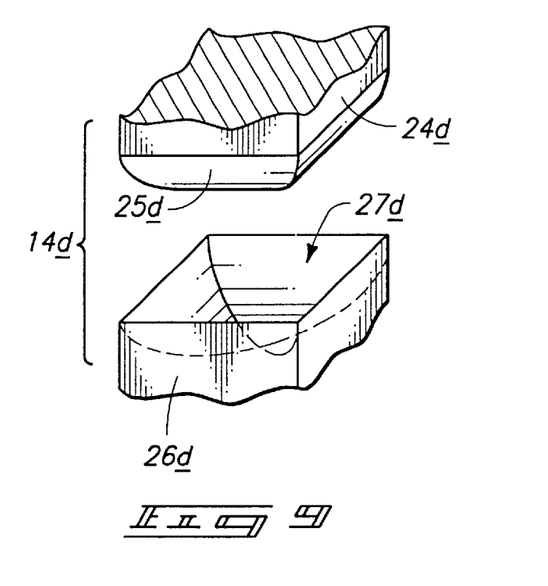
FIG. 9 is an isometric view of an electrical interconnection comprising mating pointed male and female electrical contacts.

Referring to FIG. 9, electrical interconnection 14d is illustrated. Male configuration 25d and female configuration 27d of respective electrical contacts 24d, 26d individually comprise mating members having a pair of opposing surfaces configured to join at a common point. The opposing surfaces of the pairs slope away from one another in a common direction.

Figure 10:
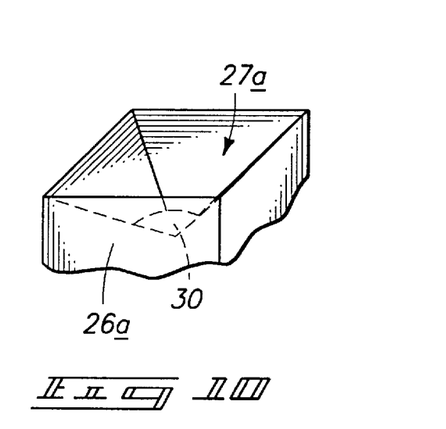
FIG. 10 is an isometric view illustrating a drop of an anisotropic conductive adhesive provided within a female configuration of an electrical contact.

Referring to FIG. 10, a glob or drop 30 of an anisotropic conductive adhesive is shown provided or applied within female configuration 27a of electrical contact 26a. Drop 30 of anisotropic conductive adhesive is preferably provided within female configuration 27a prior to mating of female electrical contact 26a with corresponding male electrical contact 24a. Drop 30 is screen printed into female configuration 27a in one embodiment although other application techniques can be used.

Using this fabrication technique, drop 30 of anisotropic conductive adhesive is maintained within female configuration 27a. This provides proper positioning of the adhesive for electrically coupling electrical contacts 24, 26 when contacts 24, 26 are mated. Gravity tends to retain adhesive drop 30 within female configuration 27a reducing outflowing of overflowing of the adhesive from the electrical interconnection area.

Although the provision of drop 30 in configuration 27a described with reference to electrical contacts 24a, 26a, this processing technique applies to other electrical contact configurations for facilitating coupling and mating of electrical contacts 24, 26. Dots or drops 30 of the anisotropic conductive adhesive or other adhesive can be dispensed or screen printed onto the bottom of any appropriate female configuration 27.

These fabrication techniques also provide improved control in isotropic adhesive applications. In particular, isotropic adhesives can be utilized to couple and adhere mating electrical contacts 24, 26.

Figure 11:
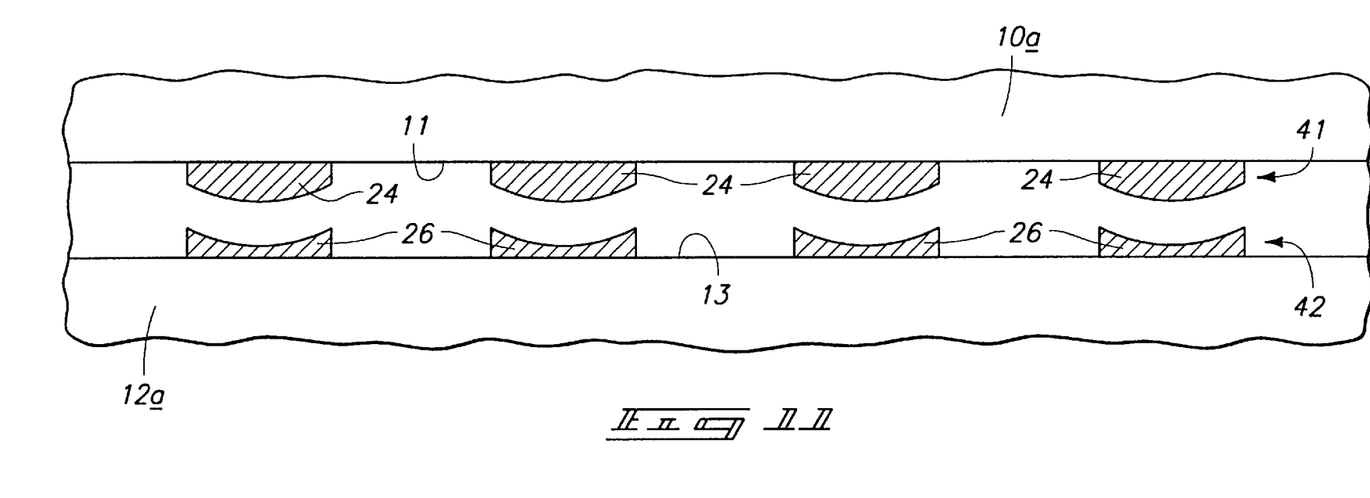
FIG. 11 is a cross-sectional view illustrating plural electrical contacts of a flip chip and plural corresponding electrical contacts of a substrate.

Referring to FIG. 11, substrate 10a includes an array 41 of male electrical contacts 24 formed upon surface 11 of substrate 10a. In addition, substrate 12a includes an array 42 of female electrical contacts 26 formed upon surface 11 of substrate 12a. Electrical contacts 24, 26 are configured upon respective surfaces 11, 13 to form mating pairs of electrical interconnections between substrate 10a and substrate 12a.

Forming electrical contacts 24, 26 having respective mating configurations 25, 27 according to the present invention provides a self-guiding or self-aligning feature which facilitates proper alignment of substrates 10a, 12a and electrical contacts 24, 26 when such substrates are coupled. Mating configurations 25, 27 assist with coupling of substrates 10, 12 by guiding the coupling and aligning of electrical contacts 24, 26.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. An electrical circuit comprising:
  a substantially electrically insulative substrate;
  circuitry coupled with substrate; and
  an electrical contact coupled with the substrate and electrically coupled with the circuitry, the electrical contact comprising a monolithic structure having one of a male configuration and a female configuration, and wherein the electrical contact comprises a bond pad.

2. The electrical circuit of claim 1 wherein the electrical contact has a male configuration.

3. The electrical circuit of claim 1 wherein the electrical contact has a female configuration.

4. The electrical circuit of claim 1 further comprising an anisotropic conductive adhesive upon the electrical contact.

5. The electrical circuit of claim 4 wherein the anisotropic conductive adhesive is laterally outward of the electrical contact.

6. An electrical circuit comprising:
  a substantially electrically insulative substrate having a surface;
  circuitry coupled with substrate; and
  an electrical contact coupled with the surface of the substrate and electrically coupled with the circuitry, the electrical contact comprising a monolithic structure which defines a planar dimension substantially parallel with the surface of the substrate, and wherein the electrical contact is adapted to couple with another electrical contact at an interface having a surface area greater than an area of the planar dimension, and wherein the electrical contact comprises a bond pad.

7. The electrical circuit of claim 6 further comprising an anisotropic conductive adhesive upon the electrical contact.

8. The electrical circuit of claim 7 wherein the anisotropic conductive adhesive is laterally outward of the electrical contact.

9. A circuit comprising:
  a first substrate comprising first circuitry and an electrical contact having a monolithic structure electrically coupled with the first circuitry; and
  a second substrate comprising second circuitry and an electrical contact having a monolithic structure electrically coupled with the second circuitry, the electrical contacts being electrically coupled with one another wherein at least a portion of one of the electrical contacts is received within the other of the electrical contacts, and wherein the electrical contacts comprise bond pads.

10. The circuit of claim 9 further comprising an anisotropic conductive adhesive intermediate the first substrate and the second substrate.

11. The circuit of claim 10 wherein the anisotropic conductive adhesive is laterally outward of the electrical contacts.

12. The circuit of claim 9 wherein at least a portion of the one electrical contact comprises a male configuration and at least a portion of the other electrical contact comprises a female configuration.

13. A circuit comprising:
  a first substrate comprising first circuitry and an electrical contact comprising a monolithic structure coupled with the first circuitry, the electrical contact of the first substrate defining a planar dimension substantially parallel with a surface of the first substrate and having an area; and
  a second substrate comprising second circuitry and an electrical contact comprising a monolithic structure coupled with the second circuitry, the electrical contact of the second substrate defining a planar dimension substantially parallel with a surface of the second substrate and having an area, the electrical contacts being electrically coupled at an interface having a surface area greater than at least one of the individual areas of the planar dimensions of the electrical contacts; and wherein the electrical contacts of the first and second substrates comprise bond pads.

14. The circuit of claim 13 wherein the planar dimensions of the electrical contacts are defined at respective interfaces of the electrical contacts with respective ones of the first and second substrates.

15. The circuit of claim 13 further comprising an anisotropic conductive adhesive intermediate the first substrate and the second substrate.

16. The circuit of claim 15 wherein the anisotropic conductive adhesive is laterally outward of the first and second electrical contacts.

17. The circuit of claim 13 wherein at least a portion of one of the electrical contacts comprises a male configuration and at least a portion of another of the electrical contacts comprises a female configuration.

18. An electrical coupling comprising:
a first electrical contact defining a planar dimension having an area and comprising a monolithic structure;
a second electrical contact defining a planar dimension having an area and comprising a monolithic structure, wherein the first electrical contact and the second electrical contact are electrically coupled at an interface having a surface area greater than at least one of the individual areas of the planar dimensions of the first and second electrical contacts; and
wherein the first and second electrical contacts comprise bond pads.

19. An electrical coupling comprising:
a first electrical contact defining a planar dimension having an area and comprising a monolithic structure;
a second electrical contact defining a planar dimension having an area and comprising a monolithic structure, wherein the first electrical contact and the second electrical contact are electrically coupled at an interface having a surface area greater than at least one of the individual areas of the planar dimensions of the first and second electrical contacts; and
an anisotropic conductive adhesive intermediate the first electrical contact and the second electrical contact.

20. The electrical coupling of claim 19 wherein the anisotropic conductive adhesive is laterally outward of the first and second electrical contacts.

21. An electrical coupling comprising:
a first electrical contact comprising a monolithic structure; and
a second electrical contact comprising a monolithic structure, the first and second electrical contacts being electrically coupled with one another and wherein at least a portion of one of the first and second electrical contacts is received within the other of the first and second electrical contacts, and wherein the first and second electrical contacts comprise bond pads.

22. The electrical coupling of claim 21 further comprising an anisotropic conductive adhesive intermediate the first and second electrical contacts.

23. The electrical coupling of claim 22 wherein the anisotropic conductive adhesive is laterally outward of the first and second electrical contacts.

24. The electrical coupling of claim 21 wherein at least a portion of the first electrical contact comprises a male configuration and at least a portion of the second electrical contact comprises a female configuration.

25. An electrical coupling comprising:
a first electrical contact comprising a monolithic structure; and
a second electrical contact comprising a monolithic structure, wherein the first electrical contact and the second electrical contact are configured to be electrically coupled with one another and to self-align with respect to one another during the electrical coupling, and wherein the first and second electrical contacts comprise bond pads.

26. The electrical coupling of claim 25 further comprising an anisotropic conductive adhesive intermediate the first electrical contact and the second electrical contact.

27. The electrical coupling of claim 26 wherein the anisotropic conductive adhesive is laterally outward of the first and second electrical contacts.

28. The electrical coupling of claim 25 wherein at least a portion of the first electrical contact comprises a male configuration and at least a portion of the second electrical contact comprises a female configuration.

29. An electrical circuit comprising:
a substantially electrically insulative substrate;
circuitry coupled with substrate;
an electrical contact coupled with the substrate and electrically coupled with the circuitry, the electrical contact comprising a monolithic structure having one of a male configuration and a female configuration; and
an anisotropic conductive adhesive upon the electrical contact.

30. The electrical circuit of claim 24 wherein the anisotropic conductive adhesive is laterally outward of the electrical contact.

31. An electrical circuit comprising:
a substantially electrically insulative substrate having a surface;
circuitry coupled with substrate;
an electrical contact coupled with the surface of the substrate and electrically coupled with the circuitry, the electrical contact comprising a monolithic structure which defines a planar dimension substantially parallel with the surface of the substrate, and wherein the electrical contact is adapted to couple with another electrical contact at an interface having a surface area greater than an area of the planar dimension; and
an anisotropic conductive adhesive upon the electrical contact.

32. The electrical circuit of claim 31 wherein the anisotropic conductive adhesive is laterally outward of the electrical contact.

33. A circuit comprising:
a first substrate comprising first circuitry and an electrical contact having a monolithic structure electrically coupled with the first circuitry;
a second substrate comprising second circuitry and an electrical contact having a monolithic structure electrically coupled with the second circuitry, the electrical contacts being electrically coupled with one another wherein at least a portion of one of the electrical contacts is received within the other of the electrical contacts; and
an anisotropic conductive adhesive intermediate the first substrate and the second substrate.

34. The circuit of claim 33 wherein the anisotropic conductive adhesive is laterally outward of the electrical contacts.

35. A circuit comprising:

a first substrate comprising first circuitry and an electrical contact comprising a monolithic structure coupled with the first circuitry, the electrical contact of the first substrate defining a planar dimension substantially parallel with a surface of the first substrate and having an area;

a second substrate comprising second circuitry and an electrical contact comprising a monolithic structure coupled with the second circuitry, the electrical contact of the second substrate defining a planar dimension substantially parallel with a surface of the second substrate and having an area, the electrical contacts being electrically coupled at an interface having a surface area greater than at least one of the individual areas of the planar dimensions of the electrical contacts; and an anisotropic conductive adhesive intermediate the first substrate and the second substrate.

36. The circuit of claim 35 wherein the anisotropic conductive adhesive is laterally outward of the electrical contacts.

37. An electrical coupling comprising:

a first electrical contact defining a planar dimension having an area and comprising a monolithic structure;

a second electrical contact defining a planar dimension having an area and comprising a monolithic structure, wherein the first electrical contact and the second electrical contact are electrically coupled at an interface having a surface area greater than at least one of the individual areas of the planar dimensions of the first and second electrical contacts; and an anisotropic conductive adhesive intermediate the first electrical contact and the second electrical contact.

38. The electrical coupling of claim 37 wherein the anisotropic conductive adhesive is laterally outward of the first electrical contact and the second electrical contact.

39. An electrical coupling comprising:

a first electrical contact comprising a monolithic structure;

a second electrical contact comprising a monolithic structure, the first and second electrical contacts being electrically coupled with one another and wherein at least a portion of one of the first and second electrical contacts is received within the other of the first and second electrical contacts; and an anisotropic conductive adhesive intermediate the first and second electrical contacts.

40. The electrical coupling of claim 39 wherein the anisotropic conductive adhesive is laterally outward of the first and second electrical contacts.

41. An electrical coupling comprising:

a first electrical contact comprising a monolithic structure;

a second electrical contact comprising a monolithic structure, wherein the first electrical contact and the second electrical contact are configured to be electrically coupled with one another and to self-align with respect to one another during the electrical coupling; and an anisotropic conductive adhesive intermediate the first electrical contact and the second electrical contact.

42. The electrical coupling of claim 41 wherein the anisotropic conductive adhesive is laterally outward of the first electrical contact and the second electrical contact.

* * * * *

UNITED STATES PATENT AND TRADEMARK OFFICE
CERTIFICATE OF CORRECTION

PATENT NO. : 6,365,842 B1
DATED : April 2, 2002
INVENTOR(S) : Tongbi Jiang

It is certified that error appears in the above-identified patent and that said Letters Patent is hereby corrected as shown below:

Title page,
Item [56], References Cited, U.S. PATENT DOCUMENTS, replace Patent No. "5,767,580" with -- 5,757,580 --.

Column 1,
Line 61, delete "is".

Column 4,
Line 50, replace "in embodiment." with -- in one embodiment. --.

Column 5,
Line 32, replace "defme" with -- define --.

Column 6,
Line 66, delete "is".

Signed and Sealed this

Twentieth Day of May, 2003

JAMES E. ROGAN
*Director of the United States Patent and Trademark Office*